United States Patent
Polizzi et al.

(10) Patent No.: US 6,892,269 B2
(45) Date of Patent: May 10, 2005

(54) NONVOLATILE MEMORY DEVICE WITH DOUBLE SERIAL/PARALLEL COMMUNICATION INTERFACE

(75) Inventors: Salvatore Polizzi, Palermo (IT); Salvatore Poli, Mascalucia (IT); Maurizio Perroni, Furnari (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 392 days.

(21) Appl. No.: 10/271,352

(22) Filed: Oct. 15, 2002

(65) Prior Publication Data

US 2003/0088729 A1 May 8, 2003

(30) Foreign Application Priority Data

Oct. 16, 2001 (IT) ...................................... VA2001A0035

(51) Int. Cl.⁷ .............................................. G06F 12/00
(52) U.S. Cl. ....................................... 711/103; 710/71
(58) Field of Search ............................ 711/103; 710/71

(56) References Cited

U.S. PATENT DOCUMENTS

| | | | | |
|---|---|---|---|---|
| 5,966,723 A | * | 10/1999 | James et al. ................ | 711/103 |
| 6,088,262 A | * | 7/2000 | Nasu ...................... | 365/185.04 |
| 6,510,487 B1 | * | 1/2003 | Raza et al. ................. | 711/100 |
| 6,571,311 B2 | * | 5/2003 | Kuwano ..................... | 711/103 |
| 6,684,275 B1 | * | 1/2004 | Goldstein .................... | 710/71 |
| 6,732,205 B2 | * | 5/2004 | Kamihara et al. ............ | 710/71 |
| 6,748,469 B1 | * | 6/2004 | Caldwell et al. .............. | 710/71 |
| 2001/0021958 A1 | * | 9/2001 | Zink et al. .................. | 711/103 |

* cited by examiner

*Primary Examiner*—Matthew Anderson
*Assistant Examiner*—Shane Thomas
(74) *Attorney, Agent, or Firm*—Lisa K. Jorgenson; Allen, Dyer, Doppelt, Milbrath & Gilchrist, P.A.

(57) ABSTRACT

A nonvolatile memory device is operable in a serial mode and in a parallel mode. The architecture of the nonvolatile memory device is based upon the structure already present in a standard memory, but includes certain modifications. These modifications include the addition of a timing state machine for the various memory access phases (i.e., writing and reading data), and the addition of an internal bus and related logic circuits for disabling the internal address bus of the standard memory when the nonvolatile memory device operates in the serial mode.

35 Claims, 7 Drawing Sheets

NONVOLATILE MEMORY DEVICE WITH DOUBLE SERIAL/PARALLEL COMMUNICATION INTERFACE

FIELD OF THE INVENTION

The present invention relates in general to nonvolatile memory devices, and in particular, to a FLASH memory device with a double interface for serial and parallel communication modes.

BACKGROUND OF THE INVENTION

Large capacity nonvolatile memory devices which are commonly based on electrically erasable and programmable floating gate memory cells of the FLASH type are used in a number of applications. Typically, these memory devices store a large volume of data that may remain unmodified or may be frequently modified.

In many applications that require a serial access mode for reading stored data, as well as for writing data in a memory array, the first or original factory programming of the memory device is commonly done in a parallel or pseudo-parallel mode. This programming is done by exploiting the "standard" parallel access mode structure of the memory device for speeding up the writing of a large volume of data in the memory before installing the pre-programmed memory device in the intended application system, such as on a PC mother board, for example.

For ordinary operation in the serial mode in many applications, low pin count (LPC) serial communication protocols are privileged. LPC type FLASH memory devices, capable of managing an LPC serial mode and a parallel mode, are thus in demand. These nonvolatile memory devices may require the largest data storage capacity for a certain type of package, and for the size of the device itself. An often required double serial-parallel functioning mode burdens the complexity of the auxiliary circuitry to be integrated in the memory device in addition to the functional circuitry of a standard FLASH memory.

SUMMARY OF THE INVENTION

In view of the foregoing background, an object of the present invention is to provide an efficient integrated interface within a standard memory device for managing a double functioning mode that includes a serial mode according to an LPC communication protocol, and a parallel mode.

This and other objects, advantages and features in accordance with the present invention are provided by an architecture that exploits structures already present in a standard FLASH memory (such as certain internal buses, registers, etc.) and introduces a small number of additional structures. This permits the integration of a multi-mode memory in a device with a package and size substantially identical to those of a common FLASH memory for standard applications (parallel or pseudo parallel access mode) having a same capacity and with the same technology.

As it will be better highlighted below, the modifications introduced in the architecture of a standard memory comprises, in particular, the structure of a timing state machine for the various memory access phases (i.e., writing and reading data), and the addition of an internal bus and related logic circuits for disabling the internal address bus of the standard memory architecture when the device is commanded to operate in a serial mode.

In particular, the nonvolatile memory device comprises a flash memory core, an input address buffer, a first internal address bus connected to the input address buffer, and a memory address bus connected to the memory core and to the first internal address bus. The nonvolatile memory device further comprises input and output data buffers, a data bus connected to the memory core and to the input and output data buffers, and an input/output data management circuit connected to the data bus.

A second internal data bus is preferably connected to the input/output data management circuit for transferring data on the data bus through the input/output data management circuit. A serial/parallel state machine is preferably connected to the second internal data bus and to the memory address bus. The serial/parallel state machine has inputs for receiving a clock signal and an external timing signal, and outputs for providing a plurality of signals. These signals preferably include an internal write enable signal for the input data buffer when the nonvolatile memory device is functioning in a serial mode, and an internal output enable signal for the output data buffer for data read from the memory core when the nonvolatile memory device is functioning in the serial mode. A third signal is also output for timing loading of addresses on the memory address bus during the nonvolatile memory device functioning in the serial mode, and for timing transfer and storage of addresses during the nonvolatile memory device functioning in a parallel mode.

A logic circuit preferably has a first input for receiving the third signal and a second input for receiving an external mode command signal, and an output connected to the first internal address bus for selecting operation of the nonvolatile memory device functioning in the serial or parallel mode based upon the external mode command signal by interrupting the path of addresses from the first internal address bus to the memory address bus when the nonvolatile memory device is functioning in the serial mode.

BRIEF DESCRIPTION OF THE DRAWINGS

The different aspects and advantages of the invention will appear even more clearly through the following description of an embodiment of the present invention and by referring to the attached drawings, wherein.

DETAILED DESCRIPTION OF THE PREFERRED EMBODIMENTS

With reference to Figures from 1 to 6 which show a functional block diagram of the architecture of the present invention, the shaded blocks represent the circuit blocks that are normally present in a typical standard FLASH memory. In the figures, these blocks are represented external the block STANDARD FLASH MEMORY CORE simply to describe the manner in which they interconnect within the multi-mode (serial/parallel) interface architecture in accordance with the present invention.

The structural modifications to the functional blocks of a standard memory are limited substantially to the block SERIAL/PARALLEL STATE MACHINE. This block constitutes the multi-mode interface circuitry that implements the timing of the various phases of the memory for the different functioning modes. An additional internal bus DATAL<7:0> is provided for transferring data present on the data bus DBUS<15:0> of the standard architecture of the memory, through the input management circuit and the INTERNAL I/O MANAGER of the standard architecture to the interface block SERIAL/PARALLEL STATE MACHINE.

Moreover, logic means are introduced, such as a logic OR gate in the depicted example, for interrupting the address input path towards the standard memory address bus AIN_INT<31:0> when the device is commanded to operate in a serial mode, and for multiplexing the addresses when commanded to operate in a parallel mode.

The pins for externally connecting the memory STANDARD FLASH MEMORY CORE are as follows:

APAD<10:0> are the pins used for inputting addresses that are commonly buffered and placed on the internal address bus AIN_INT<10:0>. These pins are used exclusively in the parallel mode.

SERIAL_BUS<3:0> are input/output pins (I/O) buffered with buffers for satisfying the particular specifications of the intended application, such as for a PCI specification, for example. Through these pins, data is transferred from and to the memory when functioning in the serial mode. That is, through these pins the interface of the device receives and sends data through the bus of the particular application, such as the PCI bus of a PC mother board, for example. Within the device, the pins SERIAL_BUS<3:0> are buffered and coupled to the internal bus SERIAL_BUS_INT<3:0>.

According to the architecture of the present invention, the internal bus and the relative pins are also used when the device operates in the parallel mode, as will be better illustrated below, for limiting the total number of required pins. DQ<3:0> are four pins that are necessary for functioning in the parallel mode.

The main signals for illustrating the features of the interface architecture of the invention are as follows:

IC sets the architecture to operate either in the serial mode or in the parallel mode, and also blocks the address input path from the internal bus AIN_INT<10:0> to the address bus of the standard memory AIN<31:0> during functioning in the serial mode.

ADD_OUTDIR times the loading of addresses stored in the block SERIAL/PARALLEL STATE MACHINE on the address bus of the memory AIN<31:0> when functioning in the serial mode, and times the loading for acquiring addresses by fractions of bursts of bits when functioning in the parallel mode.

CK is the system clock of the memory device when functioning in the serial mode.

RC is used as the timing signal for storing addresses when the memory device operates in the parallel mode.

WE_SERIAL_BUS is generated by the multi-mode interface block and functions as an internal "Write Enable" when functioning in the serial mode.

OE_SERIAL_BUS is generated by the multi-mode interface block and functions as an internal "Output Enable" when functioning in the serial mode.

According to the architecture of the present invention, besides the data bus DBUS<15:0> of the standard architecture of the memory, there is an additional bus DATAL<7:0> that is used in the serial mode for transferring data from the multi-mode interface block SERIAL/PARALLEL STATE MACHINE through the input/output managing block INTERNAL I/O MANAGER on the data bus DBUS<15:0> of the standard memory STANDARD FLASH MEMORY CORE during a writing phase. The additional bus DATAL<7:0> also transfers to the interface block SERIAL/PARALLEL STATE MACHINE the data read and transferred from the memory to the data bus DBUS<15:0> through the managing block INTERNAL I/O MANAGER.

The features of the architecture of the present invention, its outstanding simplicity of implementation and its effectiveness will become even more evident by illustrating the functioning thereof relative to significant different phases.

Serial Mode

Functioning in the serial mode is commanded by setting low the external command IC (IC=0). The signal RC for storing addresses always remains in a high logic state (RC=1) while the clock signal CK oscillates at the operating frequency of the system bus (for instance, at the frequency of the PCI bus).

Data Read in Serial Mode

Figure 1:
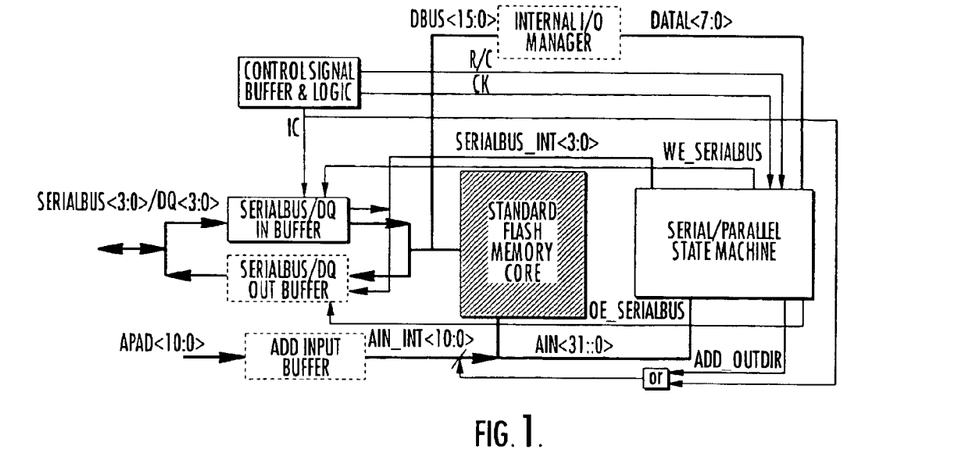
FIG. 1 is a functional block diagram that highlights the address path in a serial mode during a reading phase in accordance with the present invention.

Referring to the scheme of FIG. 1, the address, in bursts of four bits each, is forced on the pins SERIAL_BUS (<3:0>). The address is buffered by the block SERIAL_BUS/DQ IN BUFFER and arrives on the internal bus SERIAL_BUS_INT<3:0> connected to the interface state machine SERIAL/PARALLEL STATE MACHINE in which the bursts of four bits each are stored in successive clock cycles.

Successively, in a synchronous manner, the acquired address is forced on the address bus of the memory AIN<31:0>, thus arriving at the standard memory STANDARD FLASH MEMORY CORE. In this operating mode the signal IC maintains disabled the address path from the internal bus AIN_INT<10:0> to the address bus of the memory AIN<31:0>.

Figure 2:
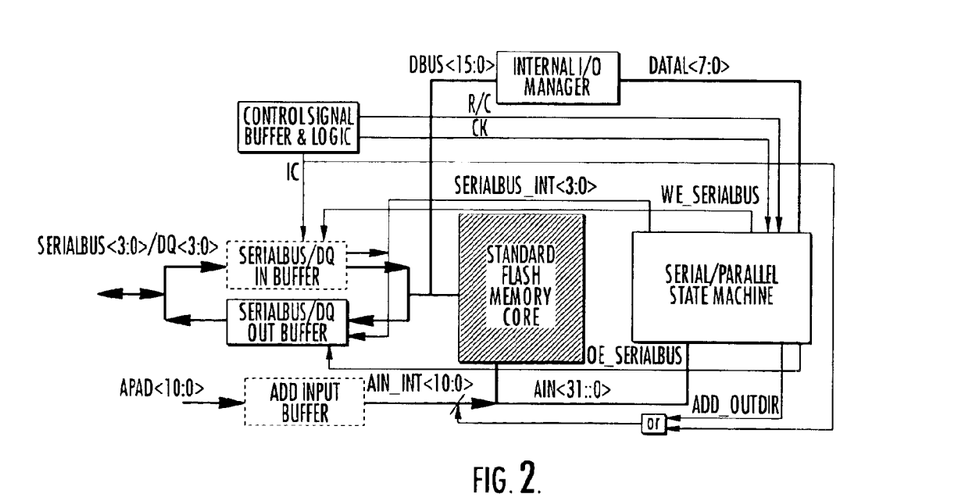
FIG. 2 is a block diagram that highlights the data path in a serial mode during a reading phase in accordance with the present invention.

Referring to FIG. 2, the memory starts reading and places the read data on its data bus DBUS<15:0>. The internal block for input/output managing INTERNAL I/O MANAGER forces eight bits of the read data on the internal bus DATAL<7:0>. This is for specifically implementing the multi-mode interface of the invention. Through this additional bus DATAL<7:0>, the bits are input to the interface state machine SERIAL/PARALLEL STATE MACHINE.

Successively, always in a synchronous manner, the multi-mode interface SERIAL/PARALLEL STATE MACHINE places data, in bursts of four bits each, on the internal bus SERIAL BUS_INT<3:0>. Through the output buffer SERIAL BUS/DQ OUT BUFFER, the bits are available on the pins SERIAL BUS<3:0>.

Data Write in Serial Mode

In this operating mode, the addresses are received by the memory STANDARD FLASH MEMORY CORE in the same manner described above for the serial mode read operation. Obviously, in a phase of data writing it is necessary to provide the memory also with the information relative to the data to be written in the matrix of nonvolatile memory cells.

Figure 3:
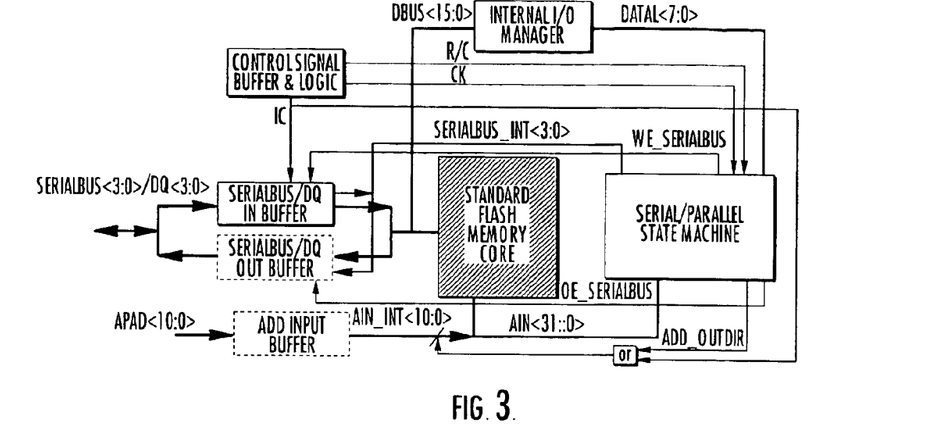
FIG. 3 is a functional block diagram that highlights the data path in a serial mode during a data writing phase in accordance with the present invention.

The data path for a writing phase in the serial mode is highlighted in the scheme of FIG. 3. Even in this case, the data is forced in bursts of four bits at a time on the pins SERIAL BUS<3:0>. After having been buffered through the internal bus SERIAL BUS_INT<3:0>, the bits are received by the interface block SERIAL/PARALLEL STATE MACHINE in which they are stored.

The stored data is successively placed on the internal bus DATAL<7:0>, and through the internal inputs/outputs management block INTERNAL I/O MANAGER, the data arrives to the data bus of the memory DBUS<15:0> and then to the memory STANDARD FLASH MEMORY CORE. At this point the memory is capable of writing the data in the matrix having the necessary address and data information.

Parallel Mode

Data Read in Parallel Mode

In the parallel mode the external command IC is set high (IC=1), the system clock signal CK is disabled (CK=0) and the signal RC is used as a synchronization signal during the address reading and storing phases. According to the illustrated architecture, the addresses are transferred by blocks of eleven bits at a time. The trailing edge and the falling edge of the external synchronization signal RC are used in two successive cycles.

Figure 4:
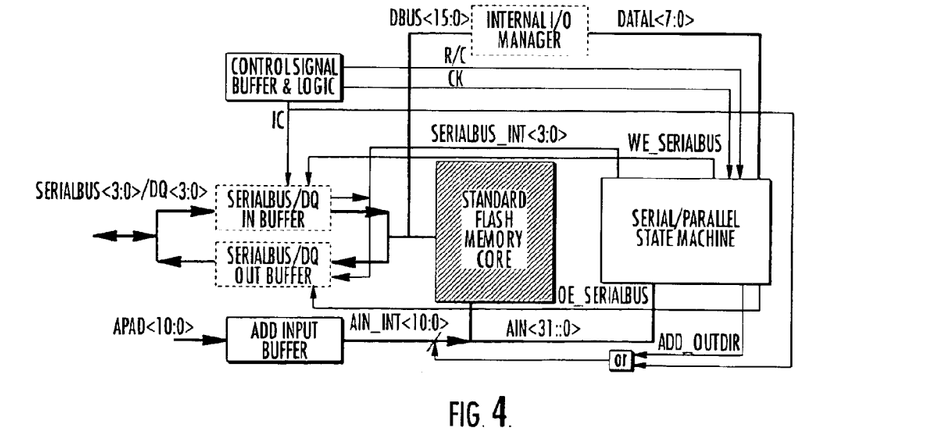
FIG. 4 is a functional block diagram that highlights the address path in a parallel mode during a reading phase in accordance with the present invention.

Referring to the scheme of FIG. 4, the addresses forced on the pins APAD<10:0>, after having been buffered, arrive onto the internal bus AIN_INT<10:0>. From there, the addresses arrive onto the address bus AIN<31:0> of the memory. The address thus arrives at the multi-mode interface SERIAL/PARALLEL STATE MACHINE in which they are stored. In this address reading phase, the signal ADD_OUTDIR keeps enabled the path from the internal bus AIN_INT<10:0> to the address bus of the memory AIN<31:0>.

Once the two blocks of eleven bits each of an address are transferred, the path between the two internal buses is interrupted by the OR logic circuit. The interface SERIAL/PARALLEL STATE MACHINE successively forces the addresses on the address bus of the memory AIN<31:0> for sending them to the memory block STANDARD FLASH MEMORY CORE.

Figure 5:
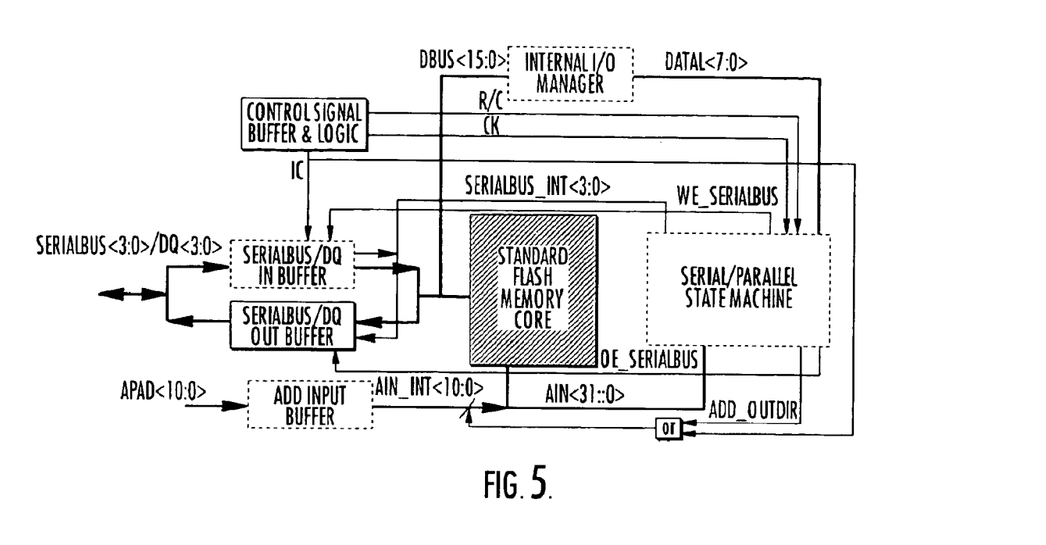
FIG. 5 is a functional block diagram that highlights the data path in a parallel mode during a reading phase in accordance with the present invention.
Figure 6:
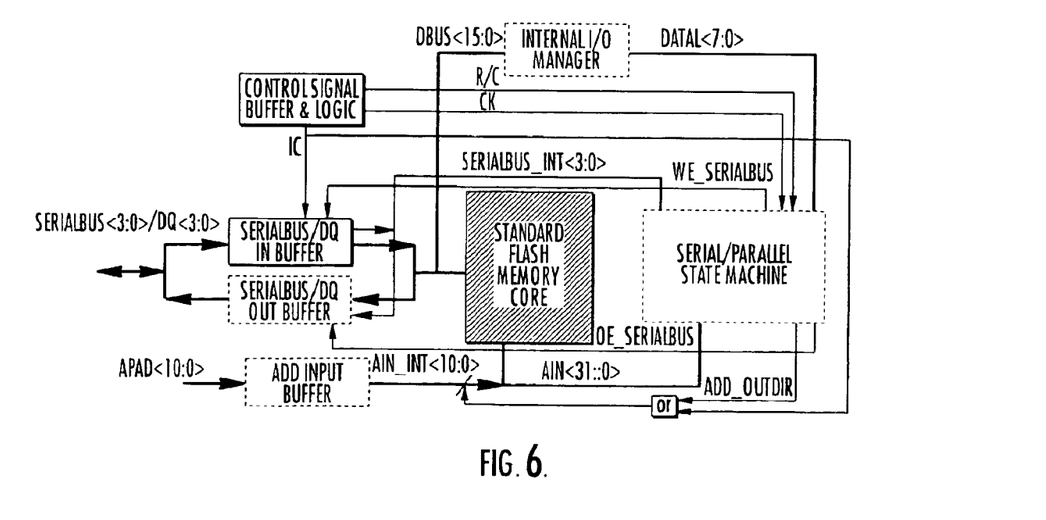
FIG. 6 is a block diagram that highlights the data path in a parallel mode during a writing phase in accordance with the present invention.

Referring to the scheme of FIG. 5, the data read from the memory, which in the considered example is 8 bits, is placed on the data bus of the memory DBUS<15:0> and is transferred, through the block SERIAL BUS/DQ OUT BUFFER, to the pins SERIAL BUS<3:0> and to the pins DQ<3:0>. In this way, the four pins of the serial bus SERIAL BUS<3:0> are exploited also when the memory device functions in the parallel mode. This reduces the total number of required pins.

Data Write in Parallel Mode

During this phase, the addresses follow the same path described above for reading data in the parallel mode. Referring to the scheme of FIG. 6, data passes through the pins SERIAL BUS<3:0> and DQ<3:0> and after having been buffered, the data is sent directly to the memory block STANDARD FLASH MEMORY CORE through the data bus of the memory DBUS<15:0>.

Figure 7:
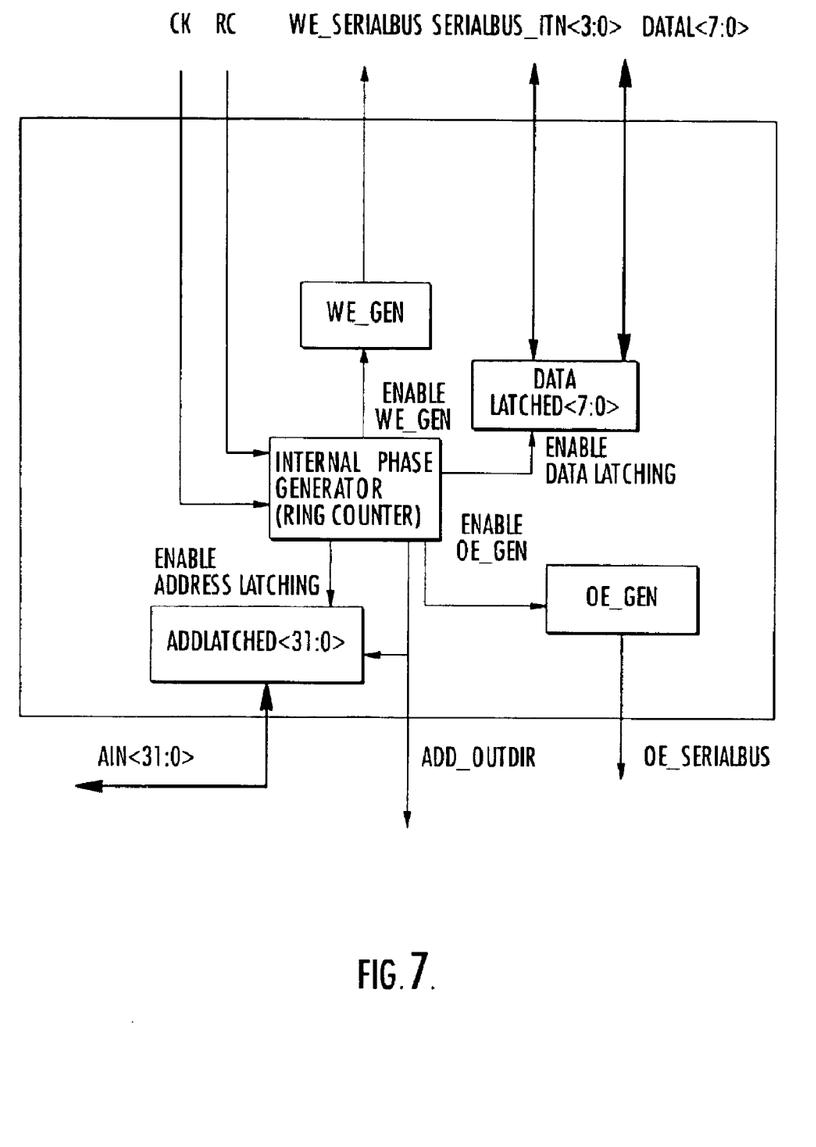
FIG. 7 is a functional block diagram of the serial/parallel state machine illustrated in FIG. 1.

FIG. 7 shows the functional block diagram of the multi-mode interface SERIAL/PARALLEL STATE MACHINE in accordance with the architecture of the present invention. The internal block PHASE GENERATOR may use a common ring counter. It receives the external clock signal CK when functioning in the serial mode and the external synchronization signal RC when functioning in the parallel mode. The internal block PHASE GENERATOR generates enabling signals for the function circuit blocks during the various phases of the serial and parallel communication protocols.

During functioning in the serial mode, the blocks WE_GEN and OE_GEN respectively generate the signals OE_SERIAL BUS that operates as an internal "OUTPUT ENABLE" signal and WE_SERIAL BUS that operates as an internal "WRITE ENABLE" signal.

In the considered sample embodiment, the block DATA LATCHED <7:0> is composed of eight bistable circuits (latches) that store data coming from the memory block STANDARD FLASH MEMORY CORE. The block ADD LATCHED is formed by thirty-two bistable circuits (latches) that acquire and store the bits of the current address before sending them to the memory block STANDARD FLASH MEMORY CORE.

The arrays of bistable circuits for storing addresses are loaded in bursts of four bits each during functioning of the device in the serial mode, and in bursts of eleven bits each during functioning in the parallel mode. In both of the functioning modes, the arrays of storage bistable circuits are loaded in a plurality of cycles of the timing signal (CK when functioning in the serial mode and RC when functioning in the parallel mode).

Figure 8:
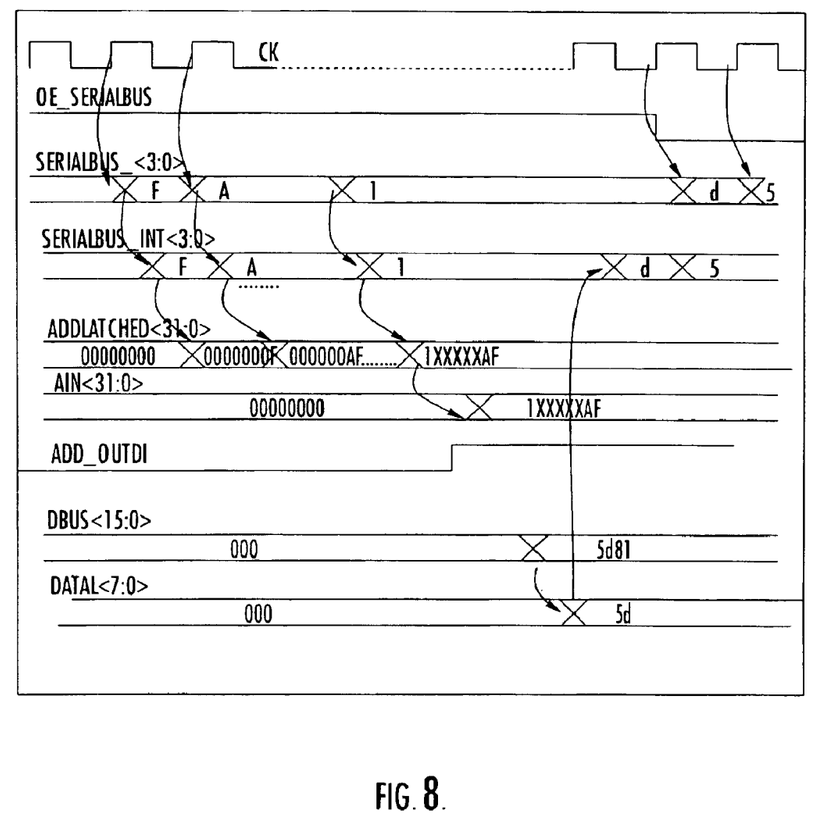
FIG. 8 is a timing diagram corresponding to a serial mode reading phase in accordance with the present invention.

For further illustrative purposes, FIG. 8 shows the fundamental timing signals relating to a data read phase in the serial mode, from which it is possible to notice the interaction between the above mentioned signals. As it may be noticed, the addresses are transmitted during successive pulses (cycles) of the clock signal CK, through the pins SERIAL BUS<3:0>, and arrive on the lines of the internal bus SERIAL BUS_INT<3:0>. The addresses thus arrive at the bistable circuits (latches) contained inside the interface SERIAL/PARALLEL STATE MACHINE.

In the diagrams of FIG. 8 the first two nibbles and the last nibble are shown, while the remaining nibbles are generically indicated with an X. After eight clock pulses, all the latches ADD LATCHED<31:0> are filled.

The signal ADD_OUDIR enables the passage of the acquired address on the address bus of the memory AIN<31:0>. The acquired address thus reaches the memory block STANDARD FLASH MEMORY CORE. In the second phase, the data read from the memory is placed on the data bus of the memory DBUS<15:0> to be successively stored inside the bistable circuits of the block DATA LATCHED<7:0> of the interface.

From the bistable circuits, in synchronization with the system clock signal CK, data is placed in groups of four bits at a time on the internal bus SERIAL BUS_INT<3:0>, and thus on the serial output pins SERIAL_BUS<3:0>. The "Output Enable" signal OE_SERIAL BUS, internally generated by the interface that enables the output buffer, is shown in FIG. 8.

Figure 9:
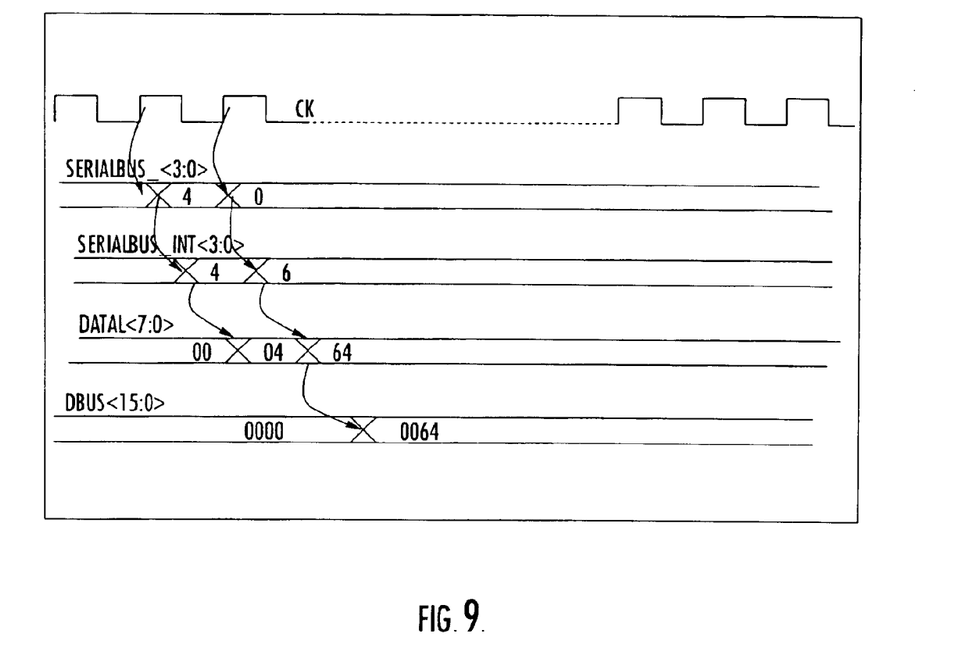
FIG. 9 is a timing diagram relative to a serial mode writing phase in accordance with the present invention.

All the values of the bus in the mentioned figure are indicated in hexadecimal notation. Furthermore, the path of data to be programmed during a writing operation in the serial mode is depicted in FIG. 9. It is possible to notice that the data from the external pins SERIALBUS<3:0> and the internal data bus SERIALBUS_INT<3:0> are stored in the block DATA LATCHED<7:0>, and successively pass on the data bus of the memory DBUS and is thus received by the memory.

Figure 10:
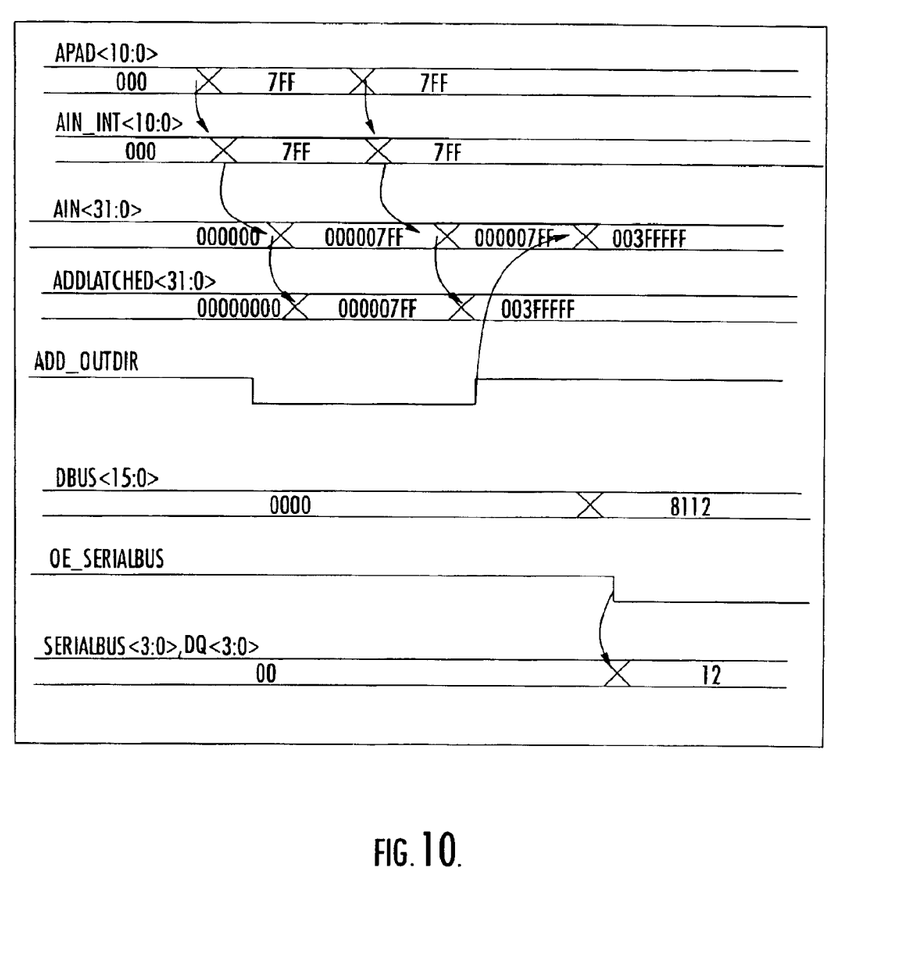
FIG. 10 is a timing diagram relative to a parallel mode reading phase in accordance with the present invention.

Timing diagrams of a read operation in the parallel mode are depicted in FIG. 10. The transition of the address bits to be read through the path going from the pins APAD<10:0> to the memory circuits of the multi-mode interface SERIAL/PARALLEL STATE MACHINE is shown. Successively and in synch with the signal ADD OUTDIR, the ADD LATCHED<31:0> are forced on the respective lines of the address bus of the standard memory AIN<31:0> for reaching the memory block, but only a portion of these address bits are used by the memory for addressing a single nonvolatile memory location of the memory array. The remaining portion of bits exist only to satisfy the specifications of the various LPC communication protocols.

The read data will be transferred from the data bus DBUS of the standard memory to the output pins, after these pins have been enabled by the block INTERNAL I/O MANAGER. Obviously, only 8 bits of the 16 bits will be output.

That which is claimed is:

1. A nonvolatile memory device comprising:
    a memory core;
    an input address buffer;
    a first internal address bus connected to said input address buffer;
    a memory address bus connected to said memory core and to said first internal address bus;
    input and output data buffers;
    a data bus connected to said memory core and to said input and output data buffers;
    an input/output data management circuit connected to said data bus;
    a second internal data bus connected to said input/output data management circuit for transferring data on said data bus through said input/output data management circuit;
    a serial/parallel state machine connected to said second internal data bus and to said memory address bus, said serial/parallel state machine having inputs for receiving a clock signal and an external timing signal, and outputs for providing
        an internal write enable signal to said input data buffer when the nonvolatile memory device is functioning in a serial mode,
        an internal output enable signal to said output data buffer for data read from said memory core when the nonvolatile memory device is functioning in the serial mode, and
        a third signal for timing loading of addresses on said memory address bus during the nonvolatile memory device functioning in the serial mode, and for timing transfer and storage of addresses during the nonvolatile memory device functioning in a parallel mode; and
    circuit means having a first input for receiving the third signal and a second input for receiving an external mode command signal, and an output connected to said first internal address bus for selecting operation of the nonvolatile memory device functioning in the serial or parallel mode based upon the external mode command signal by interrupting the path of addresses from said first internal address bus to said memory address bus when the nonvolatile memory device is functioning in the serial mode.

2. A nonvolatile memory device according to claim 1, wherein said circuit means comprises an OR logic gate.

3. A nonvolatile memory device according to claim 1, wherein the clock signal is for timing operation of the nonvolatile memory device functioning in the serial mode; and wherein the external timing signal is for timing operation of the nonvolatile memory device functioning in the parallel mode.

4. A nonvolatile memory device according to claim 1, wherein the external timing signal is for timing reception and storage of addresses during the nonvolatile memory device functioning in the parallel mode.

5. A nonvolatile memory device according to claim 1, further comprising:
    a serial internal input/output data bus connected to said input and output data buffers; and
    a control circuit connected to said input and output data buffers for control thereof.

6. A nonvolatile memory device according to claim 1, further comprising at least one serial interface circuit for communicating in the serial mode; and at least one parallel interface circuit for communicating in the parallel mode.

7. A nonvolatile memory device according to claim 1, wherein said serial/parallel state machine comprises a phase generator having inputs for receiving the clock signal and the external timing signal, and outputs for providing a first enabling signal, a second enabling signal, a third enabling signal and a fourth enabling signal.

8. A nonvolatile memory device according to claim 7, further comprising a serial internal input/output data bus connected to said input and output data buffers; and wherein said serial/parallel state machine further comprises:
    a first array of storage circuits having an input for receiving the first enabling signal, and an output connected to said memory address bus; and
    a second array of data storage circuits having an input for receiving the second enabling signal, and outputs connected to said second internal data bus and to said serial internal input/output data bus.

9. A nonvolatile memory device according to claim 8, wherein said first array of storage circuits comprising a plurality of bistable circuits, each bistable circuit being connected to a respective line of said memory address bus; and wherein said second array of storage circuits comprising a plurality of bistable circuits, each bistable circuit being connected to a respective line of said second internal data bus and to said serial internal input/output data bus.

10. A nonvolatile memory device according to claim 8, wherein the third signal synchronizes the loading of addresses present in said first array of storage circuits during the nonvolatile memory device functioning in the serial mode, and the transfer and storage in said first array of storage circuits of the addresses during the nonvolatile memory device functioning in the parallel mode.

11. A nonvolatile memory device according to claim 7, further comprising:
    a first signal generator having an input for receiving the third enabling signal, and an output for providing the internal write enable signal; and
    a second signal generator having an input for receiving the fourth enabling signal, and an output for providing the internal output enable signal.

12. A nonvolatile memory device according to claim 7, wherein said phase generator comprises a ring counter.

13. A nonvolatile memory device according to claim 1, wherein said memory core comprises a flash memory core.

14. A nonvolatile memory device comprising:
    a flash memory core;
    an input address buffer;
    a first internal address bus connected to said input address buffer;

a memory address bus connected to said memory core and to said first internal address bus;

input and output data buffers;

a data bus connected to said memory core and to said input and output data buffers;

an input/output data management circuit connected to said data bus;

a second internal data bus connected to said input/output data management circuit for transferring data on said data bus through said input/output data management circuit;

a serial/parallel state machine connected to said second internal data bus and to said memory address bus, said serial/parallel state machine having inputs for receiving a clock signal and an external timing signal, and outputs for providing
   an internal write enable signal to said input data buffer when the nonvolatile memory device is functioning in a serial mode,
   an internal output enable signal to said output data buffer for data read from said memory core when the nonvolatile memory device is functioning in the serial mode, and
   a third signal for timing loading of addresses on said memory address bus during the nonvolatile memory device functioning in the serial mode, and for timing transfer and storage of addresses during the nonvolatile memory device functioning in a parallel mode; and a logic circuit having a first input for receiving the third signal and a second input for receiving an external mode command signal, and an output connected to said first internal address bus for selecting operation of the nonvolatile memory device functioning in the serial or parallel mode based upon the external mode command signal.

15. A nonvolatile memory device according to claim 14, wherein said logic circuit comprises an OR logic gate.

16. A nonvolatile memory device according to claim 14, wherein an output signal from said logic circuit interrupts the path of addresses from said first internal address bus to said memory address bus when the nonvolatile memory device is functioning in the serial mode.

17. A nonvolatile memory device according to claim 14, wherein the clock signal is for timing operation of the nonvolatile memory device functioning in the serial mode; and wherein the external timing signal is for timing operation of the nonvolatile memory device functioning in the parallel mode.

18. A nonvolatile memory device according to claim 14, wherein the external timing signal is for timing reception and storage of addresses during the nonvolatile memory device functioning in the parallel mode.

19. A nonvolatile memory device according to claim 14, further comprising:
   a serial internal input/output data bus connected to said input and output data buffers; and
   a control circuit connected to said input and output data buffers for control thereof.

20. A nonvolatile memory device according to claim 14, further comprising at least one serial interface circuit for communicating in the serial mode; and at least one parallel interface circuit for communicating in the parallel mode.

21. A nonvolatile memory device according to claim 14, wherein said serial/parallel state machine comprises a phase generator having inputs for receiving the clock signal and the external timing signal, and outputs for providing a first enabling signal, a second enabling signal, a third enabling signal and a fourth enabling signal.

22. A nonvolatile memory device according to claim 21, further comprising a serial internal input/output data bus connected to said input and output data buffers; and wherein said serial/parallel state machine further comprises:
   a first array of storage circuits having an input for receiving the first enabling signal, and an output connected to said memory address bus; and
   a second array of data storage circuits having an input for receiving the second enabling signal, and outputs connected to said second internal data bus and to said serial internal input/output data bus.

23. A nonvolatile memory device according to claim 22, wherein said first array of storage circuits comprising a plurality of bistable circuits, each bistable circuit being connected to a respective line of said memory address bus; and wherein said second array of storage circuits comprising a plurality of bistable circuits, each bistable circuit being connected to a respective line of said second internal data bus and to said serial internal input/output data bus.

24. A nonvolatile memory device according to claim 22, wherein the third signal synchronizes the loading of addresses present in said first array of storage circuits during the nonvolatile memory device functioning in the serial mode, and the transfer and storage in said first array of storage circuits of the addresses during the nonvolatile memory device functioning in the parallel mode.

25. A nonvolatile memory device according to claim 21, further comprising:
   a first signal generator having an input for receiving the third enabling signal, and an output for providing the internal write enable signal; and
   a second signal generator having an input for receiving the fourth enabling signal, and an output for providing the internal output enable signal.

26. A method for selectively operating a nonvolatile memory device in serial and parallel modes, the nonvolatile memory device comprising a flash memory core; an input address buffer; a first internal address bus connected to the input address butter; a memory address bus connected to the memory core and to the first internal address bus; input and output data buffers; a data bus connected to the memory core and to the input and output data buffers; an input/output data management circuit connected to the data bus; a second internal data bus connected to the input/output data management circuit for transferring data on the data bus through the input/output data management circuit; a serial/parallel state machine connected to the second internal data bus and to the memory address bus, the method comprising:
   generating a clock signal and an external timing signal for the serial/parallel state machine;
   generating from the serial/parallel state machine
      an internal write enable signal for the input data buffer when the nonvolatile memory device is functioning in the serial mode,
      an internal output enable signal for the output data buffer for data read from the memory core when the nonvolatile memory device is functioning in the serial mode,
      a third signal for timing loading of addresses on the memory address bus during the nonvolatile memory device functioning in the serial mode, and for timing transfer and storage of addresses during the nonvolatile memory device functioning in the parallel mode, and an external mode command signal; and applying the third signal to a first input of a logic circuit and the external mode command signal to a second input of the logic circuit for providing an output signal to the first internal address bus for selecting operation of the nonvolatile memory device functioning in the serial or parallel mode based upon the external mode command signal.

27. A method according to claim 26, wherein the logic circuit comprises an OR logic gate.

28. A method according to claim 26, wherein an output signal from the logic circuit interrupts the path of addresses from the first internal address bus to the memory address bus when the nonvolatile memory device is functioning in the serial mode.

29. A method according to claim 26, wherein the clock signal is for timing operation of the nonvolatile memory device functioning in the serial mode; and wherein the external timing signal is for timing operation of the nonvolatile memory device functioning in the parallel mode.

30. A method according to claim 26, wherein the external timing signal is for timing reception and storage of addresses during the nonvolatile memory device functioning in the parallel mode.

31. A method according to claim 26, wherein the serial/parallel state machine comprises a phase generator having inputs for receiving the clock signal and the external timing signal, and outputs for providing a first enabling signal, a second enabling signal, a third enabling signal and a fourth enabling signal.

32. A method according to claim 31, further comprising a serial internal input/output data bus connected to the input and output data buffers; and wherein the serial/parallel state machine further comprises:

a first array of storage circuits having an input for receiving the first enabling signal, and an output connected to the memory address bus; and a second array of data storage circuits having an input for receiving the second enabling signal, and an output connected to the second internal data bus and to the serial internal input/output data bus.

33. A method according to claim 32, wherein the first array of storage circuits comprises a plurality of bistable circuits, each bistable circuit being connected to a respective line of the memory address bus; and wherein the second array of storage circuits comprises a plurality of bistable circuits, each bistable circuit being connected to a respective line of the second internal data bus and to the serial internal input/output data bus.

34. A method according to claim 32, wherein the third signal synchronizes the loading of addresses present in the first array of storage circuits during the nonvolatile memory device functioning in the serial mode, and the transfer and storage in the first array of storage circuits of the addresses during the nonvolatile memory device functioning in the parallel mode.

35. A method according to claim 31, further comprising:

a first signal generator having an input for receiving the third enabling signal, and an output for providing the internal write enable signal; and a second signal generator having an input for receiving the fourth enabling signal, and an output for providing the internal output enable signal.

* * * * *